United States Patent
Shi et al.

(10) Patent No.: US 9,953,964 B2
(45) Date of Patent: Apr. 24, 2018

(54) METHOD FOR MANUFACTURING SEMICONDUCTOR PACKAGE

(71) Applicants: Hongbin Shi, Hwaseong-si (KR); Soonbum Kim, Suwon-si (KR); Junho Lee, Suwon-si (KR)

(72) Inventors: Hongbin Shi, Hwaseong-si (KR); Soonbum Kim, Suwon-si (KR); Junho Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/240,183

(22) Filed: Aug. 18, 2016

(65) Prior Publication Data

US 2017/0077074 A1 Mar. 16, 2017

(30) Foreign Application Priority Data

Sep. 14, 2015 (KR) .................. 10-2015-0129460

(51) Int. Cl.
| | |
|---|---|
| *H01L 21/00* | (2006.01) |
| *H01L 25/10* | (2006.01) |
| *H01L 25/00* | (2006.01) |

(52) U.S. Cl.
CPC ............ *H01L 25/105* (2013.01); *H01L 25/50* (2013.01); *H01L 2224/16225* (2013.01); *H01L 2224/48227* (2013.01); *H01L 2225/1058* (2013.01); *H01L 2225/1082* (2013.01); *H01L 2924/15311* (2013.01); *H01L 2924/181* (2013.01);

(Continued)

(58) Field of Classification Search
CPC ................. H01L 25/105; H01L 25/50; H01L 2225/1058; H01L 2225/1082
See application file for complete search history.

(56) References Cited

U.S. PATENT DOCUMENTS

| | | |
|---|---|---|
| 5,477,086 A | 12/1995 | Rostoker et al. |
| 7,576,438 B2 | 8/2009 | Jung et al. |
| 8,546,932 B1 | 10/2013 | Chung |

(Continued)

FOREIGN PATENT DOCUMENTS

| | | |
|---|---|---|
| KR | 10-2005-0058722 A | 6/2005 |
| KR | 10-2007-0085179 A | 8/2007 |
| KR | 10-2015-0047747 A | 5/2015 |

*Primary Examiner* — Bradley K Smith
(74) *Attorney, Agent, or Firm* — Harness, Dickey & Pierce, P.L.C.

(57) ABSTRACT

A method for manufacturing a semiconductor package including providing a first semiconductor package including a first package substrate and a first solder ball, the first package substrate having a first surface and a second surface opposite to the first surface, the first solder ball on the first surface, providing a second semiconductor package including a second package substrate and a second solder ball, the second package substrate having a third surface and a fourth surface opposite to the third surface, the second solder ball on the third surface, forming a depression in the first solder ball, applying flux to the first solder ball to fill the depression, aligning the first semiconductor package and the second semiconductor package with each other such that the second solder ball is inserted into the depression, and performing a reflow process to combine the first solder ball with the second solder ball may be provided.

15 Claims, 24 Drawing Sheets

(52) U.S. Cl.
CPC ................ *H01L 2924/1815* (2013.01); *H01L 2924/18161* (2013.01); *H01L 2924/3511* (2013.01)

(56) References Cited

U.S. PATENT DOCUMENTS

| | | |
|---|---|---|
| 9,030,838 B2 | 5/2015 | You et al. |
| 9,245,867 B2 * | 1/2016 | Yim ................. H01L 23/10 |
| 2005/0127508 A1 | 6/2005 | Lee et al. |
| 2008/0257595 A1 | 10/2008 | Hu |
| 2008/0315433 A1 | 12/2008 | Chen et al. |
| 2012/0309187 A1 | 12/2012 | Sri-Jayantha et al. |
| 2013/0228916 A1 | 9/2013 | Mawatari |
| 2014/0131896 A1 | 5/2014 | Yu et al. |
| 2014/0138816 A1 | 5/2014 | Lu et al. |
| 2014/0138826 A1 | 5/2014 | Kumar |
| 2014/0151878 A1 | 6/2014 | Lin et al. |
| 2014/0151880 A1 | 6/2014 | Kao et al. |
| 2014/0252657 A1 | 9/2014 | Liu et al. |
| 2014/0264856 A1 * | 9/2014 | Huang ................. H01L 25/074 257/738 |
| 2015/0115426 A1 | 4/2015 | Lee et al. |

* cited by examiner

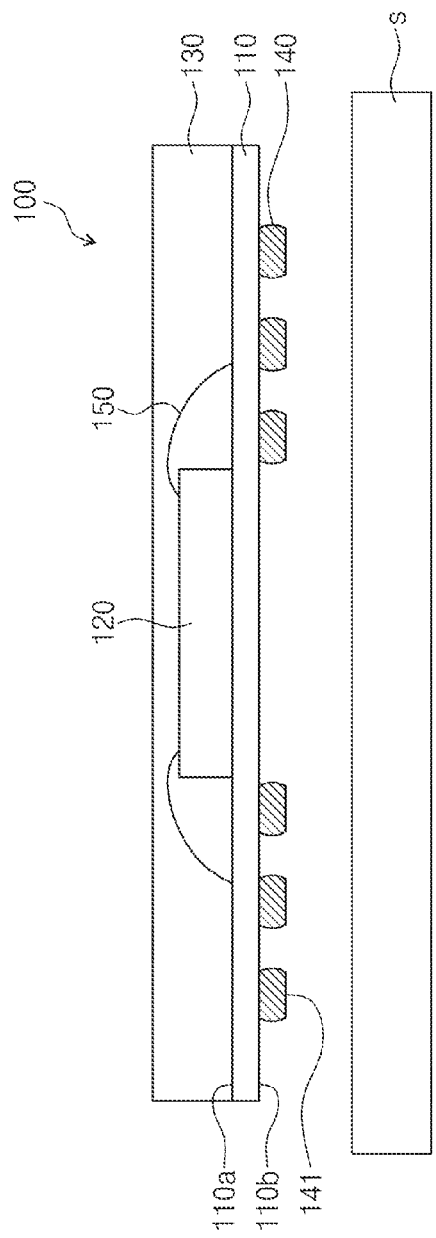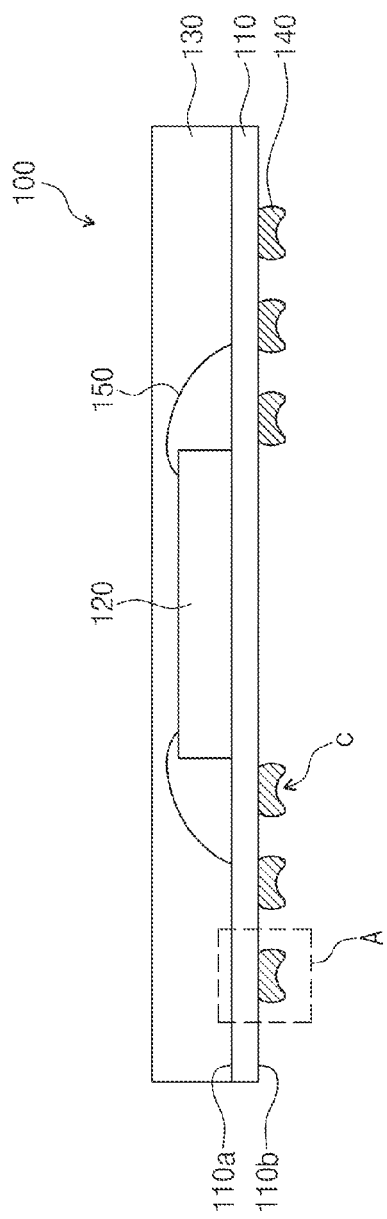

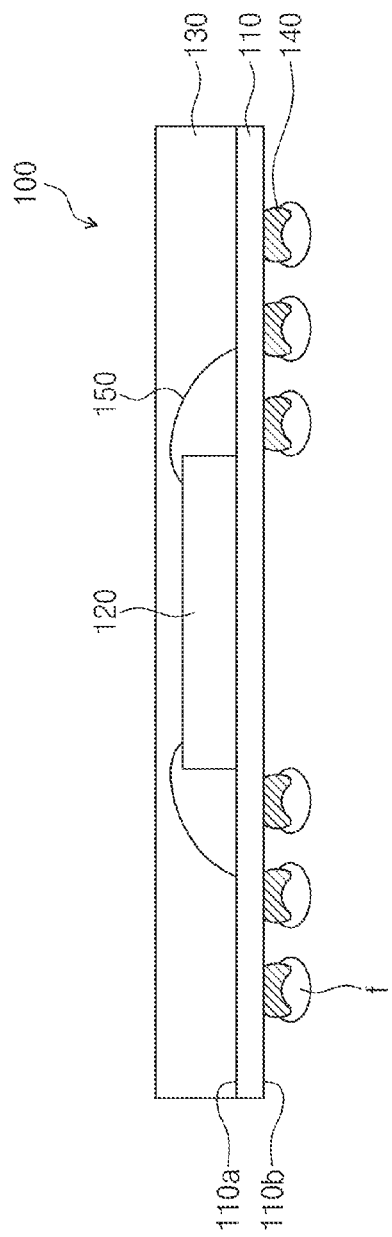
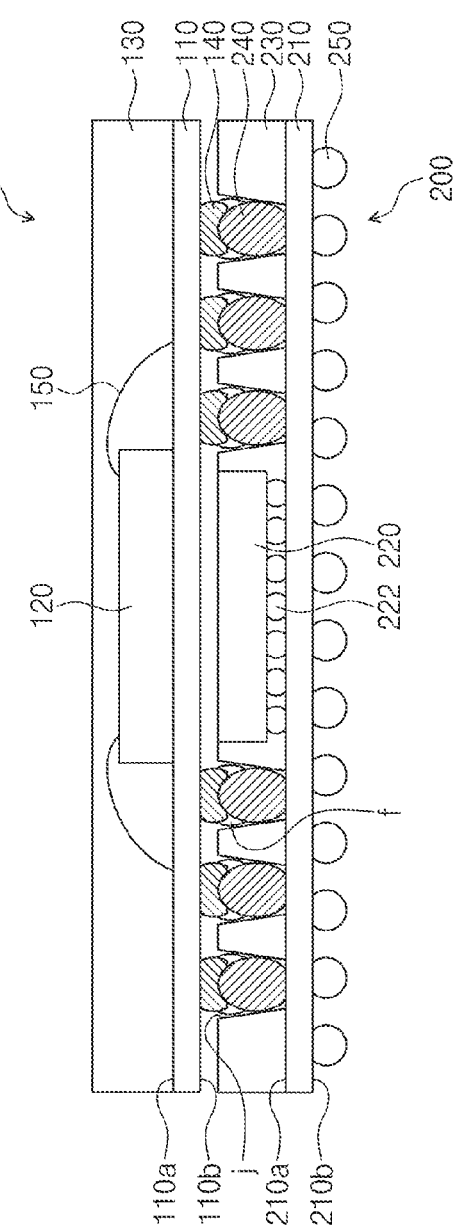

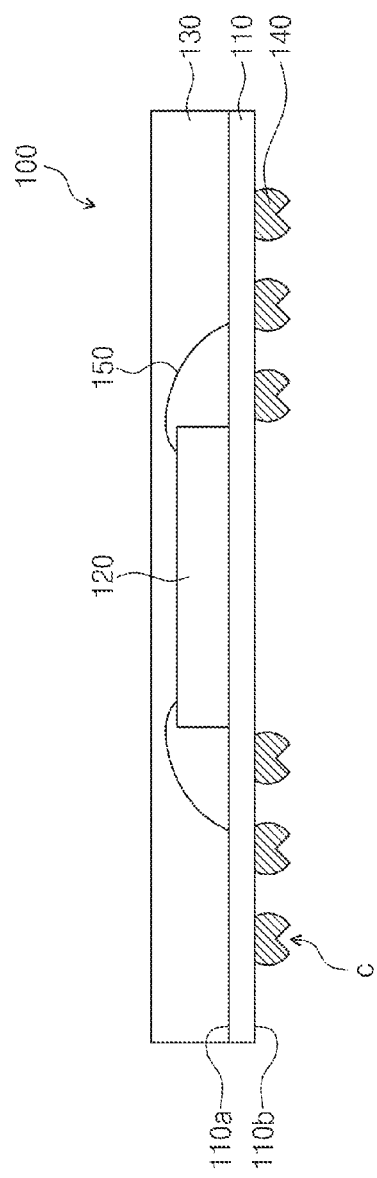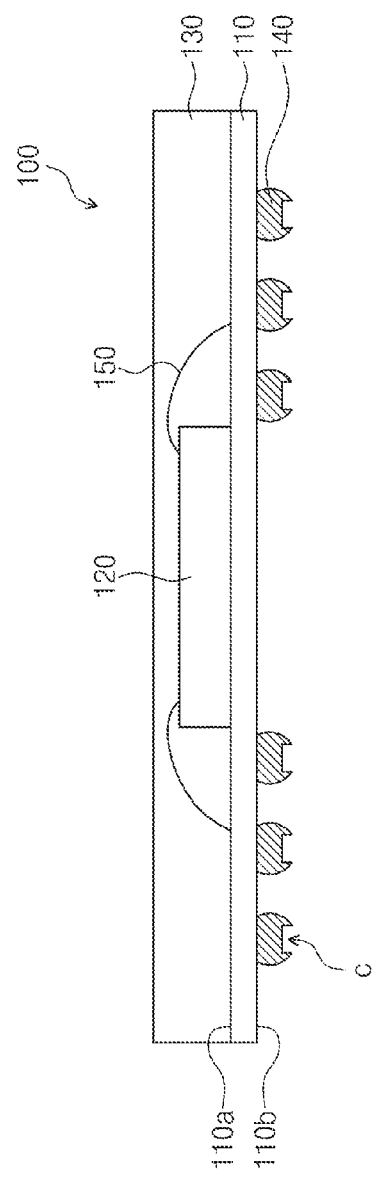

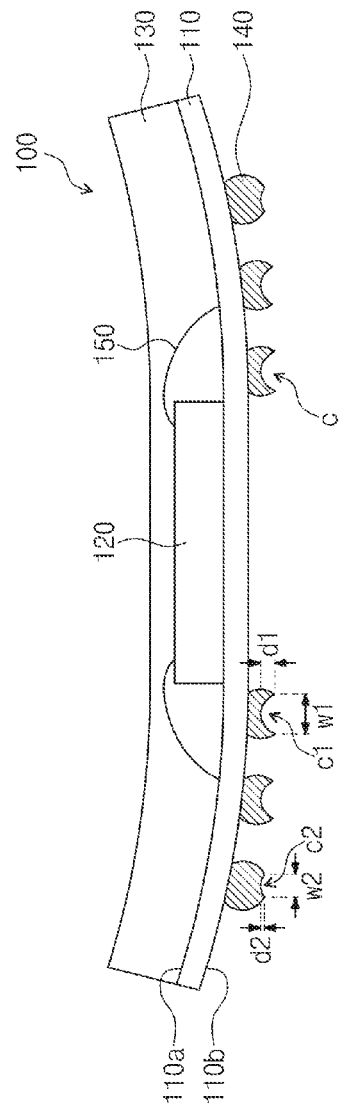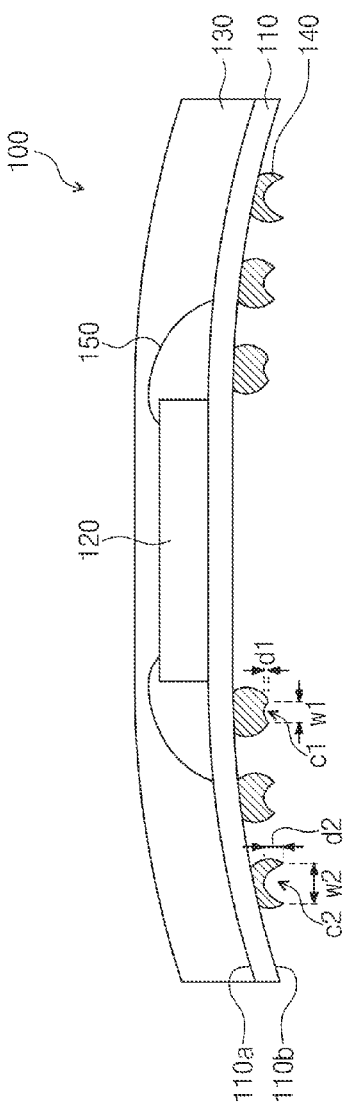

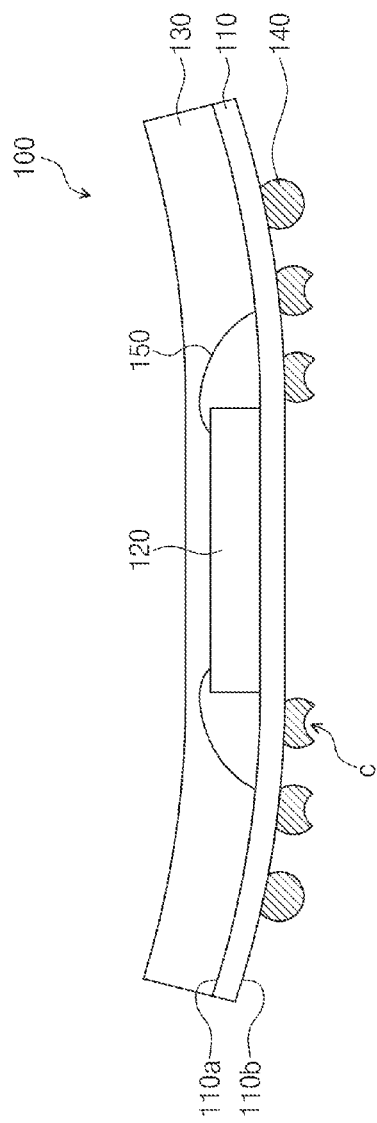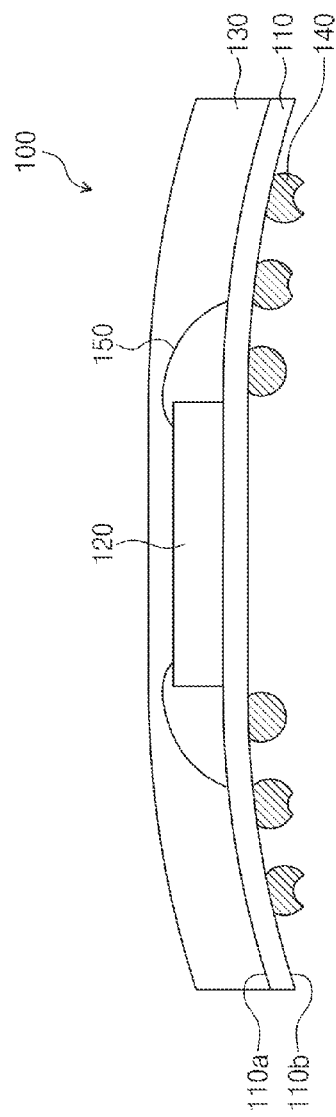

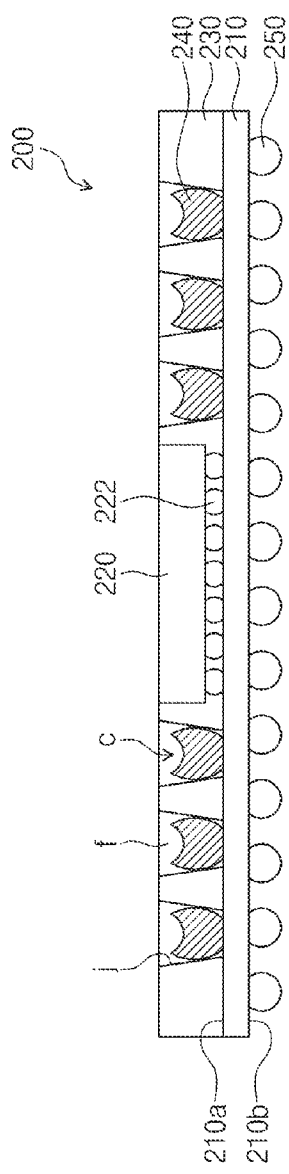
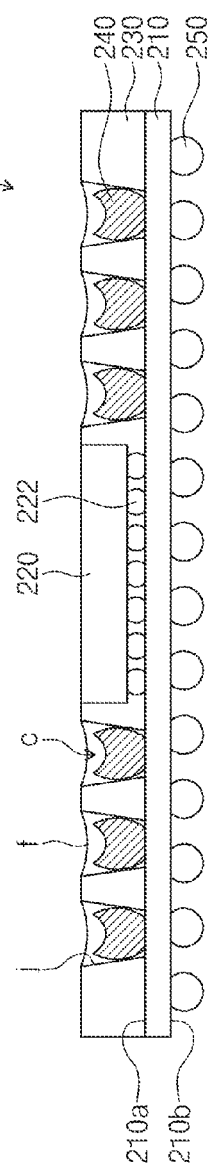

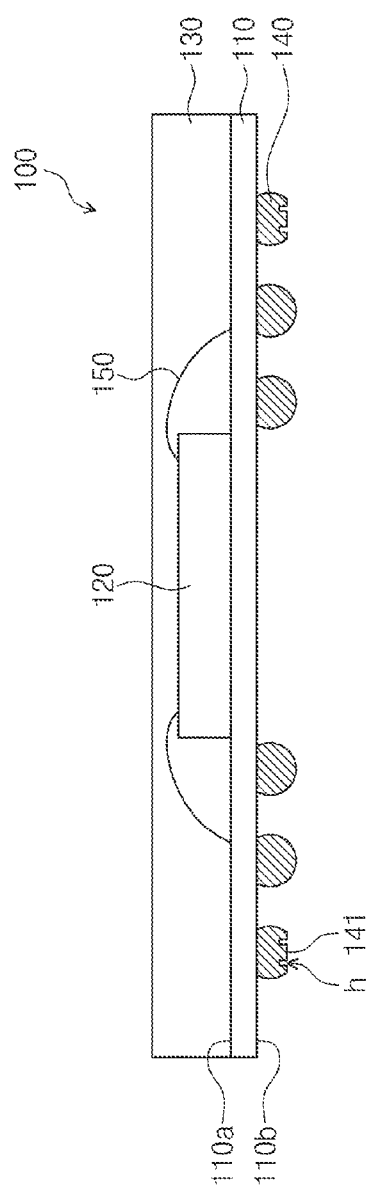
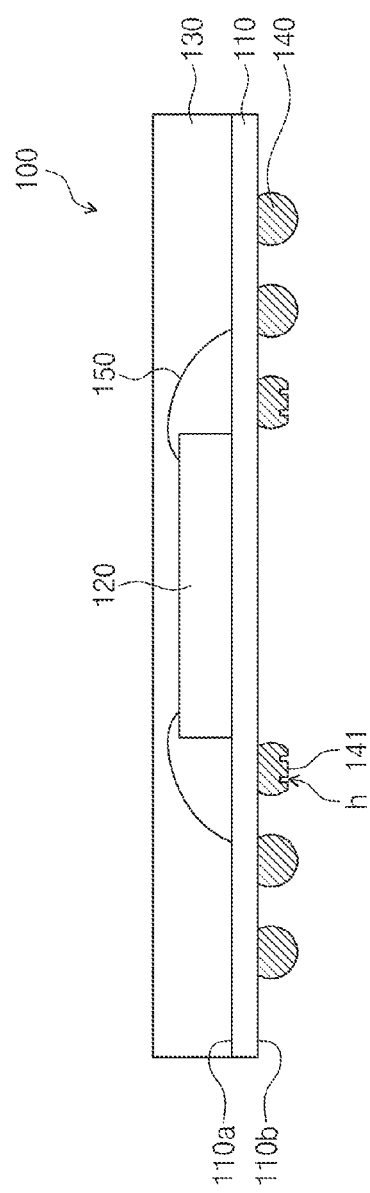

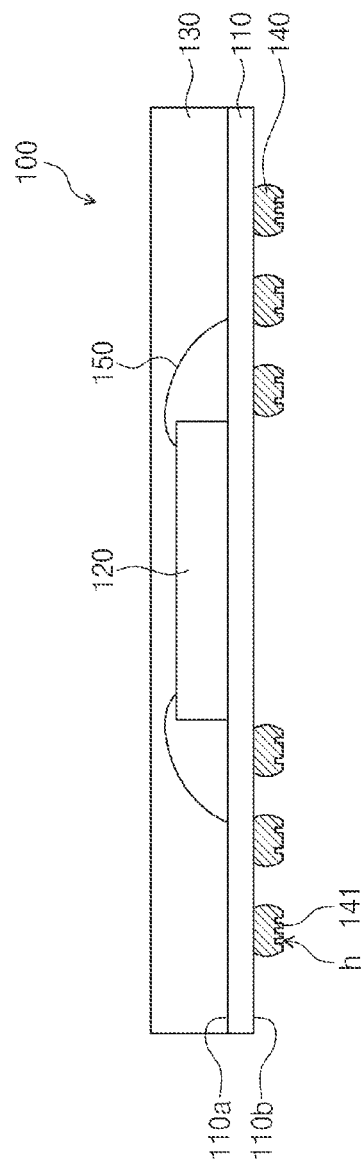
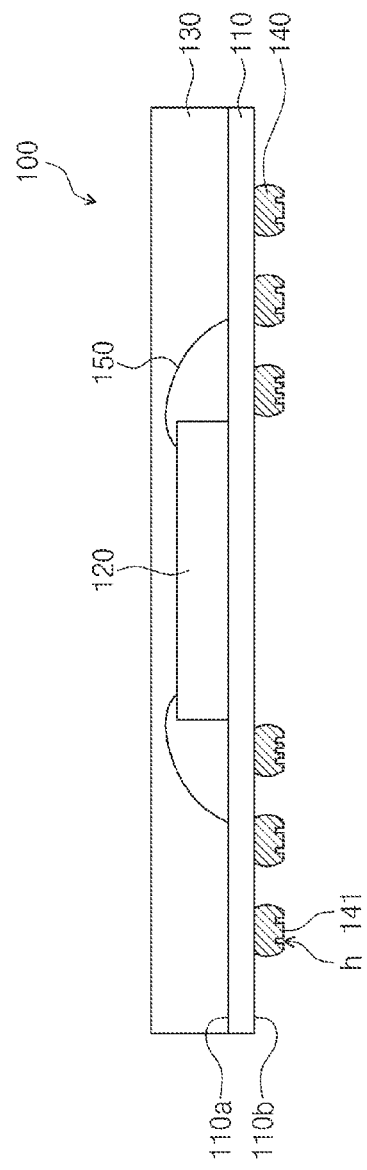

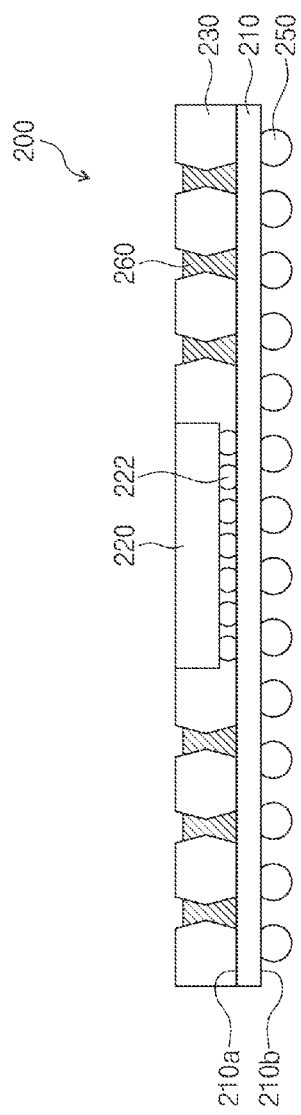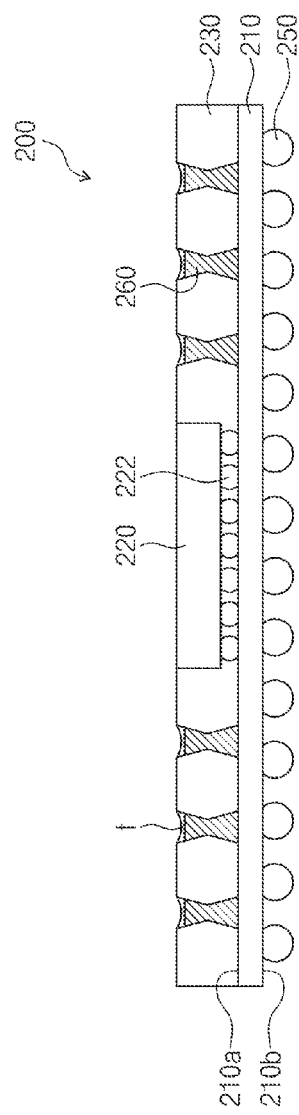

METHOD FOR MANUFACTURING SEMICONDUCTOR PACKAGE

CROSS-REFERENCE TO RELATED APPLICATION

This U.S. non-provisional patent application claims priority under 35 U.S.C. § 119 to Korean Patent Application No. 10-2015-0129460, filed on Sep. 14, 2015, in the Korean Intellectual Property Office, the disclosure of which is hereby incorporated by reference in its entirety.

BACKGROUND

The inventive concepts relate to methods for manufacturing a semiconductor package and, more particularly, to methods for manufacturing a semiconductor package with improved bonding reliability.

Higher-functional, higher-speed, and higher-density semiconductor devices and electronic products have been demanded in the semiconductor industry and the electronic industry. To satisfy these demands, various semiconductor-mounting techniques have been developed.

For example, a package-on-package (PoP) technique of stacking a package on another package has been developed to stack a plurality of semiconductor chips vertically and to realize a higher-density chip stack. The PoP technique may integrate semiconductor chips having various functions in an area smaller than a conventional package technique.

In general, a lower package may be electrically connected to an upper package through solder balls in a product realized by the PoP technique. Thus, improved bonding reliability of the solder balls may be desired for good electrical connection between the upper package and the lower package. The improved bonding reliability of the solder balls may be desired in other various semiconductor devices as well as the PoP product.

SUMMARY

Some example embodiments of the inventive concepts may provide methods for manufacturing a semiconductor package capable of coupling an upper package to a lower package, while avoiding or mitigating a non-wet failure between the upper and lower packages.

According to an example embodiment, a method for manufacturing a semiconductor package includes providing a first semiconductor package, the first semiconductor package including a first package substrate and a first solder ball, the first package substrate having a first surface and a second surface opposite to the first surface, the first solder ball on the first surface, providing a second semiconductor package, the second semiconductor package including a second package substrate and a second solder ball, the second package substrate having a third surface and a fourth surface opposite to the third surface, the second solder ball on the third surface, forming a depression in the first solder ball, applying flux to the first solder ball to fill the depression, aligning the first semiconductor package and the second semiconductor package with each other such that the second solder ball is inserted into the depression, and performing a reflow process to combine the first solder ball with the second solder ball.

In some example embodiments, the method may further include performing, before the forming a depression, a planarization process to form a planarized surface of the first solder ball. The planarized surface may be spaced apart from the first surface and may be substantially parallel to the first surface.

In some example embodiments, the performing a planarization process may include disposing the first semiconductor package on a solder resist substrate such that the first solder ball is brought into contact with a surface of the solder resist substrate, reflowing the first solder ball, and pressing the first solder ball.

In some example embodiments, the first semiconductor package may further include a first semiconductor chip on the second surface, the first semiconductor chip electrically connected to the first solder ball. The second semiconductor package may further comprise a second semiconductor chip on the third surface, the first semiconductor chip electrically connected to the second solder ball. The aligning may include disposing the first semiconductor package on the second semiconductor package.

In some example embodiments, the first semiconductor package may further include a first semiconductor chip on the first surface and electrically connected to the first solder ball. The second semiconductor package may further include a second semiconductor chip on the fourth surface and electrically connected to the second solder ball. The aligning may include disposing the second semiconductor package on the first semiconductor package.

In some example embodiments, the forming a depression in the first solder ball may include performing at least one of a laser drilling process (LDP), a pressing process, an arc ion beam etching process and a reflow process.

In some example embodiments, the first semiconductor package may further comprise a plurality of first solder balls including the first solder ball. The forming a depression may include forming one or more depressions, which includes the depression, in one or more of the first solder balls, respectively, such that at least one of a width and a depth of a first depression from among the one or more depressions may be different from at least one of a width and a depth of a second depression from among the one or more depressions.

In some example embodiments, the forming one or more depressions may include forming the first depression in one solder ball, from among the solder balls, adjacent to a central portion of the first package substrate, and forming the second depression in another solder ball, from among the first solder balls, adjacent to a peripheral portion of the first package substrate such that at least one of the width and the depth of the first depression may be smaller than at least one of the width and the depth of the second depression.

In some example embodiments, the first semiconductor package may further comprise a plurality of first solder balls including the first solder ball. The forming a depression may include forming one or more depressions, which includes the depression, in one or more of the first solder balls, respectively.

In some example embodiments, the aligning may include approximating the first semiconductor package to the second semiconductor package, and vibrating the first semiconductor package and the second semiconductor package such that the second solder ball is inserted into the depression of the first solder ball.

According to an example embodiment, a method for manufacturing a semiconductor package includes providing a first semiconductor package, the first semiconductor package including a first package substrate and first solder balls, the first package substrate having a first surface and a second surface opposite to the first surface, the first solder balls on the first surface, providing a second semiconductor package, the second semiconductor package including a second package substrate and second solder balls, the second package substrate having a third surface and a fourth surface opposite to the third surface, the second solder balls on the third surface, forming a first set of recesses in one or some of the first solder balls, respectively, applying flux to the first solder balls to the first set of recesses, aligning the first semiconductor package and the second semiconductor package with each other such that the first solder balls are brought into contact with the second solder balls, and performing a reflow process to combine the first solder balls with the second solder balls.

In some example embodiments, the first semiconductor package may further include forming a second set of recesses in others of the first sold balls, respectively, and a number of the first set of recesses may b different from a number of a second set of recesses.

In some example embodiments, the forming a first set of recesses may form the first set of recesses in one of the first solder balls, from among the first solder balls, adjacent to a central portion of the first package substrate and the forming a second set of recesses may form the second set of recesses in another first solder ball, from among the first solder balls, adjacent to a peripheral portion of the first package substrate such that the number of the first set of recesses is greater than the number of the second set of recesses.

In some example embodiments, the forming a first set of recesses may form the first set of recesses in one of the first solder balls, from among the first solder balls, adjacent to a central portion of the first package substrate, and the forming a second set of recesses may form the second set of recesses in another first solder ball, from among the first solder balls, adjacent to a peripheral portion of the first package substrate, the number of the first set of recesses is less than the number of the second set of recesses.

In some example embodiments, the forming a first set recesses may include forming one or more sets of recesses, which include the first set of recesses, in one or some of the first solder balls, respectively.

According to an example embodiment, a method for manufacturing a semiconductor package includes providing a first semiconductor package, the first semiconductor package including a first package substrate, a semiconductor chip, a mold layer, the semiconductor chip bonded to the first package substrate in a flip-chip manner, the mold layer surrounding the semiconductor chip on the first package substrate, providing a second semiconductor package, the second semiconductor package including a second package substrate and a solder ball, forming a through hole through the mold layer, forming a conductive via in the through hole such that a top surface of the conductive via being one of equal to and lower than a top surface of the mold layer, forming a concave portion defined by the top surface of the conductive via and the mold layer, applying flux to the concave portion, aligning the first semiconductor package and the second semiconductor package with each other such that the solder ball is inserted into the concave portion, and performing a reflow process to combine the solder ball with conductive via.

In some example embodiments, the forming a concave portion may include recessing the conductive via such that the top surface of the conductive via is lower than a top surface of the mold layer.

In some example embodiments, the forming a conductive via may include forming the conductive via to have a concave sidewall profile.

In some example embodiments, the aligning may include vibrating at least one of the first semiconductor package and the second semiconductor package such that the solder ball of the second semiconductor package is inserted into the concave portion.

In some example embodiments, the providing a first semiconductor package may include forming the mold layer to expose a top surface of the semiconductor chip.

BRIEF DESCRIPTION OF THE DRAWINGS

The inventive concepts will become more apparent in view of the attached drawings and accompanying detailed description.

FIGS. 1A to 1H are cross-sectional views illustrating a method for manufacturing a semiconductor package, according to an example embodiment of the inventive concepts.

FIGS. 2A to 2C are cross-sectional views of upper packages to illustrate depressions formed in upper solder balls.

FIGS. 3A to 3D are cross-sectional views illustrating methods for forming depressions in upper solder balls, according to an example embodiment of the inventive concepts.

FIGS. 5A to 5C are cross-sectional views illustrating a method for forming depressions in lower solder balls.

FIGS. 9A to 9D are cross-sectional views of holes in upper solder balls, according to example embodiments of the inventive concepts.

FIGS. 11A and 11B are cross-sectional views illustrating a method for manufacturing a semiconductor package, according to an example embodiment of the inventive concepts.

DETAILED DESCRIPTION

The advantages and features of the inventive concepts will be apparent from the following example embodiments that will be described in more detail with reference to the accompanying drawings. It should be noted, however, that the inventive concepts are not limited to the following example embodiments, and may be implemented in various forms.

Figure 4:
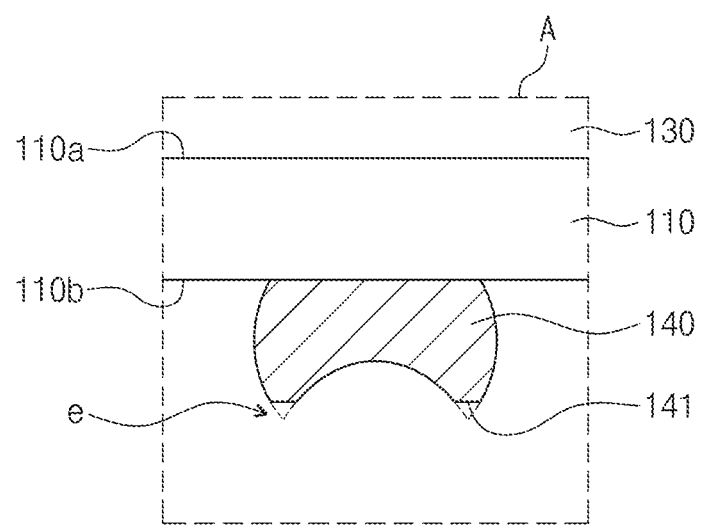
FIG. 4 is an enlarged view of a region 'A' of FIG. 1E.
Figure 5A:
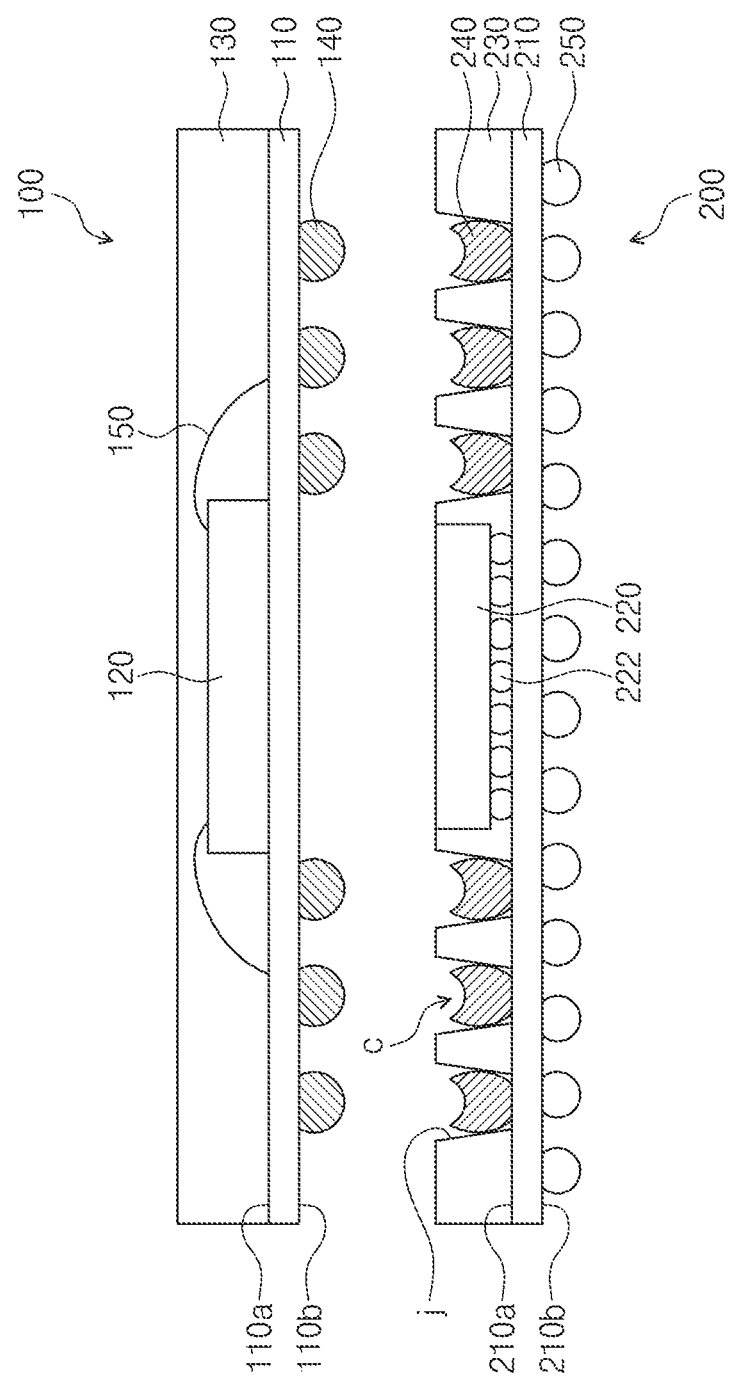
Figure 6:
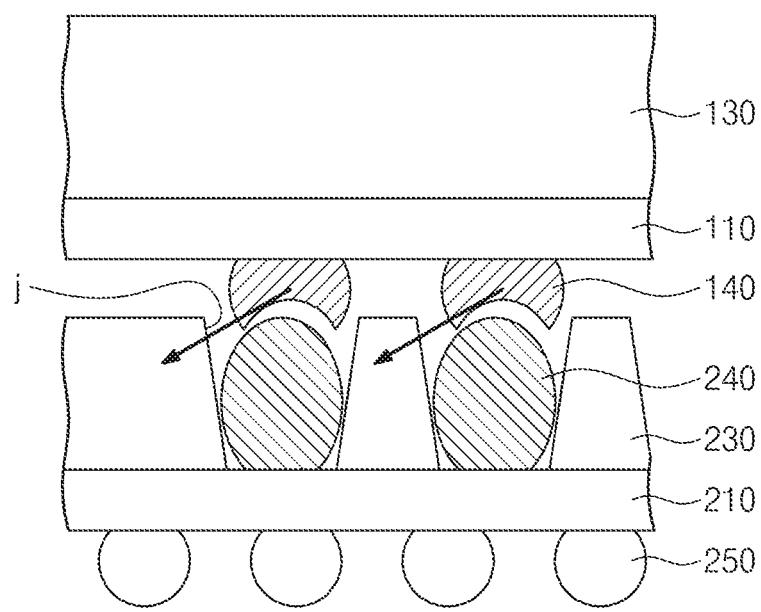
FIG. 6 is an enlarged cross-sectional view illustrating a method for aligning an upper semiconductor package with a lower semiconductor package.

FIGS. 1A to 1H are cross-sectional views illustrating a method for manufacturing a semiconductor package, according to an example embodiment of the inventive concepts. FIGS. 2A to 2C are cross-sectional views of upper packages to illustrate depressions formed in upper solder balls. FIGS. 3A to 3D are cross-sectional views illustrating methods for forming depressions in upper solder balls, according to an example embodiment of the inventive concepts. FIG. 4 is an enlarged view of a region 'A' of FIG. 1E. FIGS. 5A to 5C are cross-sectional views illustrating a method for forming depressions in lower solder balls. FIG. 6 is an enlarged cross-sectional view illustrating a method for aligning an upper semiconductor package with a lower semiconductor package.

Figure 1A:
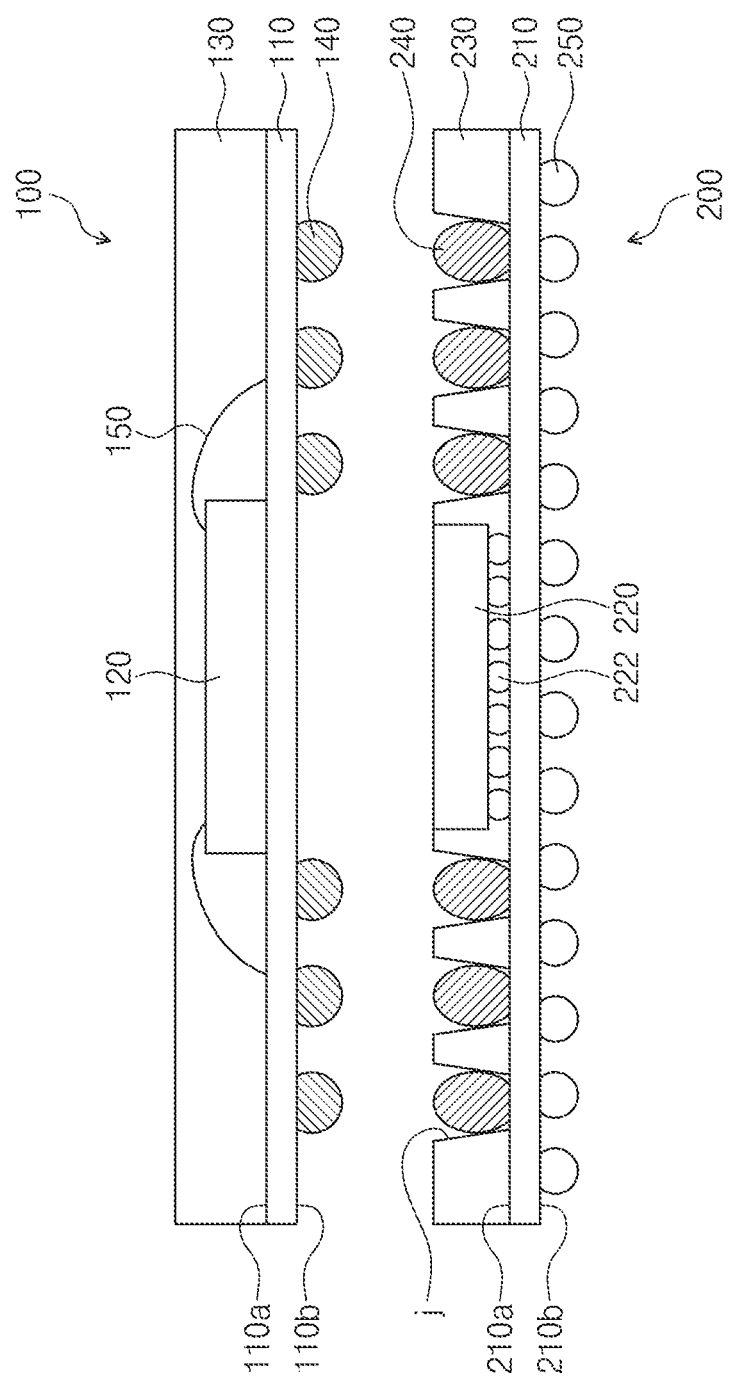
Figure 2C:
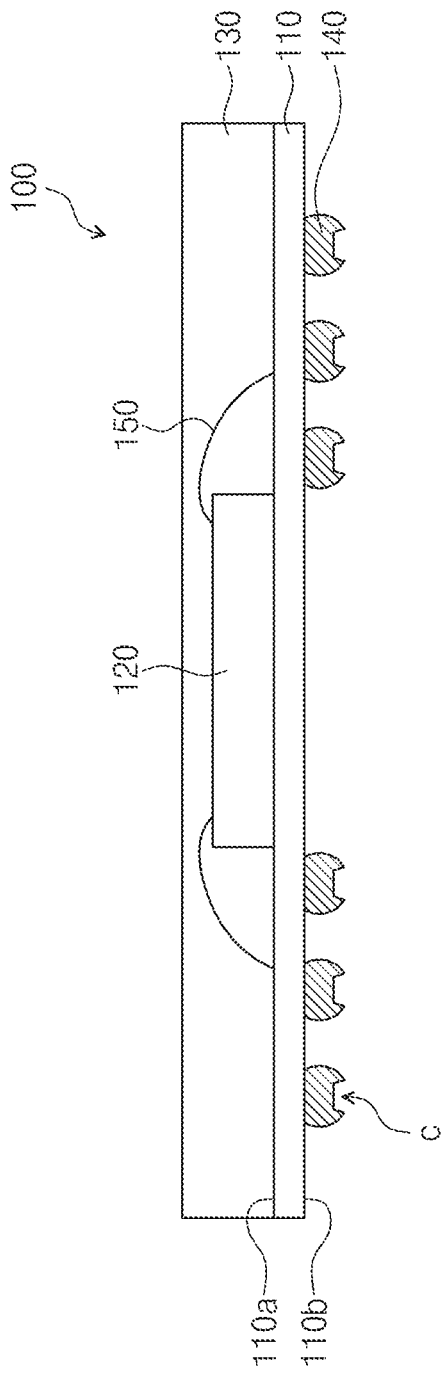

Referring to FIG. 1A, an upper semiconductor package 100 and a lower semiconductor package 200 may be provided.

The upper semiconductor package 100 may include an upper package substrate 110, an upper semiconductor chip 120, an upper mold layer 130, and upper solder balls 140.

The upper package substrate 110 may include a first top surface 110a and a first bottom surface 110b opposite to the first top surface 110a. The upper package substrate 110 may be a printed circuit board (PCB) including a circuit pattern.

The upper semiconductor chip 120 may be mounted on the first top surface 110a, of the upper package substrate 110. In some example embodiments, the upper semiconductor chip 120 may be electrically connected to the first top surface 110a by a wire bonding technique. For example, the upper semiconductor chip 120 may be electrically connected to the upper package substrate 110 through bonding wires 150. The upper semiconductor chip 120 may adhere to the upper package substrate 110 with an insulating adhesive layer (not shown) interposed therebetween. The upper semiconductor chip 120 may be a logic chip or a memory chip. In some example embodiments, the upper semiconductor chip 120 may be the memory chip. In FIG. 1A, one upper semiconductor chip 120 may be included in the upper semiconductor package 100. However, example embodiments of the inventive concepts are not limited thereto. In certain example embodiments, the upper semiconductor package 100 may include two or more upper semiconductor chips 120 which are stacked.

The upper mold layer 130 may be disposed on the upper package substrate 110 to mold the upper semiconductor chip 120. For example, the upper mold layer 130 may be provided to cover the upper semiconductor chip 120 and the first top surface 110a of the upper package substrate 110. The upper mold layer 130 may include an insulating polymer material (e.g., epoxy molding compound (EMC)).

The upper solder balls 140 may be disposed on the first bottom surface 110b of the upper package substrate 110. The upper solder balls 140 may adhere to the first bottom surface 110b of the upper package substrate 110 so as to be electrically connected to the upper package substrate 110 and the upper semiconductor chip 120. In the specification, the term 'solder' may mean, for example, tin, gold, silver, copper, or any alloy (e.g., SnIn, SnAu, SnCu, or SnBi) thereof and the term 'solder ball' may mean a conductor having a shape which is the same as or similar to a sphere.

The lower semiconductor package 200 may include a lower package substrate 210, a lower semiconductor chip 220, a lower mold layer 230, and lower solder balls 240.

The lower package substrate 210 may include a second top surface 210a and a second bottom surface 210b opposite to the second top surface 210a. The lower package substrate 210 may be a printed circuit board (PCB) including a circuit pattern. External terminals 250 (e.g., solder balls or solder bumps) may be disposed on the second bottom surface 210b of the lower package substrate 210.

The lower semiconductor chip 220 may be mounted on the second top surface 210a of the lower package substrate 210. In some example embodiments, the lower semiconductor chip 220 may be mounted on the second top surface 210a of the lower package substrate 210 by a flip chip bonding technique. For example, the lower semiconductor chip 220 may be electrically connected to the lower package substrate 210 through connection terminals 222 such as solder balls or solder bumps. However, example embodiments of the inventive concepts are not limited thereto. In certain example embodiments, the lower semiconductor chip 220 may be electrically connected to the lower package substrate 210 through bonding wires (not shown). The lower semiconductor chip 220 may be a logic chip or a memory chip. In some example embodiments, the lower semiconductor chip 220 may be the logic chip.

The lower mold layer 230 may be disposed on the lower package substrate 210 to mold the lower semiconductor chip 220. In some example embodiments, the lower mold layer 230 may expose a top surface of the lower semiconductor chip 220. However, example embodiments of the inventive concepts are not limited thereto. The lower mold layer 230 may have joint holes j exposing portions of the second top surface 210a of the lower package substrate 210. The joint holes j may penetrate the lower mold layer 230. The joint holes j may be spaced apart from the lower semiconductor chip 220. The joint holes j may be provided to be symmetrical with respect to the lower conductor chip 220. The lower mold layer 230 may include an insulating polymer material (e.g., epoxy molding compound (EMC)).

The lower solder balls 240 may be provided in the joint holes j, respectively. The lower solder balls 240 may adhere to the second top surface 210a of the lower package substrate 210 so as to be electrically connected to the lower package substrate 210 and the lower semiconductor chip 220.

Next, a process for planarizing lower portions of the upper solder balls 140 may be performed. The planarization process of the upper solder balls 140 may be performed to reduce or prevent defects from occurring during a subsequent process of forming a depression c. Performing the planarization process may include performing, for example, a pressing process or coining process together with a reflow process. The planarization process of the upper solder balls 140 will be described in detail with reference to FIGS. 1B to 1D.

Figure 1B:
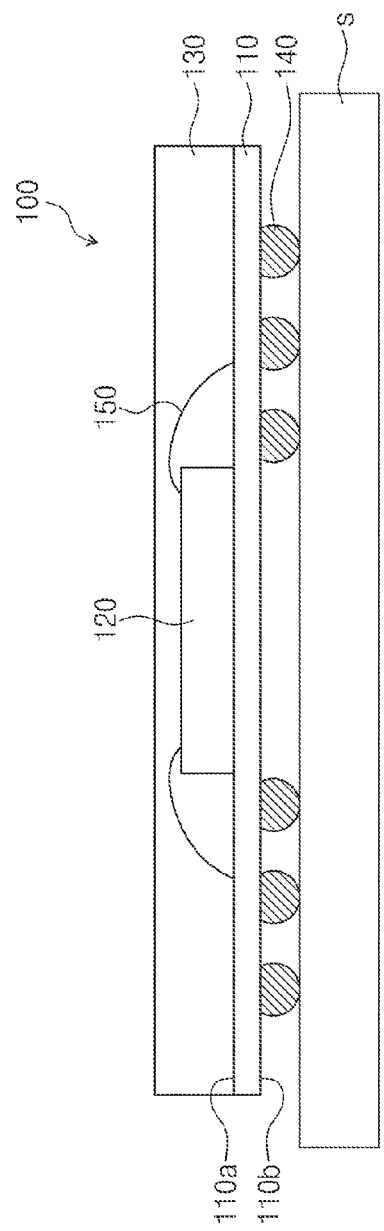

Referring to FIG. 1B, a solder resist substrate s having a flat top surface may be prepared. The upper semiconductor package 100 may be disposed on the solder resist substrate s such that the lower portions of the upper solder balls 140 come in contact with the flat top surface of the solder resist substrate s.

Figure 1C:
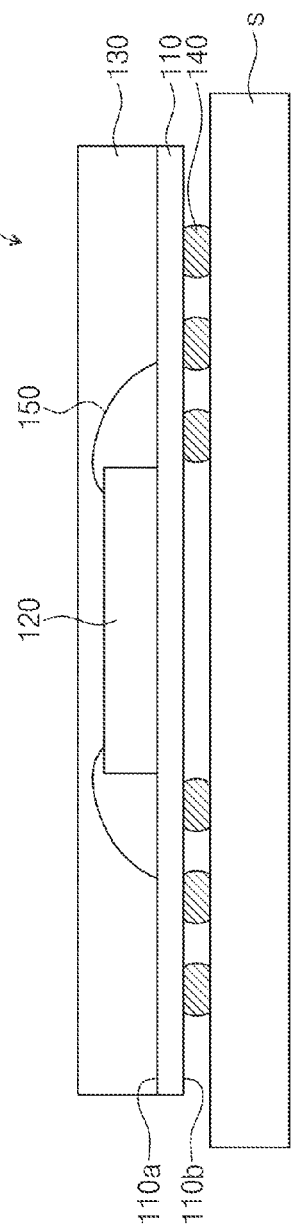

Referring to FIG. 1C, a reflow process may be performed on the upper solder balls 140. The upper semiconductor package 100 may be pressed toward the solder resist substrate s to planarize the lower portions of the upper solder balls 140. Pressing the upper semiconductor package 100 toward the solder resist substrate s may be performed simultaneously with or after the reflow process of the upper solder balls 140. Pressing the upper semiconductor package 100 toward the solder resist substrate s may include, for example, a pressing process or a coining process.

Referring to FIG. 1D, the solder resist substrate s may be separated from the upper semiconductor package 100 to form planarized surfaces 141 at bottom ends of the upper solder balls 140. The planarized surfaces 141 may be substantially parallel to the first bottom surface 110b of the upper package substrate 100. The planarized surfaces 141 may be spaced apart from the first bottom surface 110b. In certain example embodiments, the planarization process of the upper solder balls may be omitted.

Referring to FIG. 1E, a recess process may be performed to form depressions c in the upper solder balls 140. For example, lower portions of the upper solder balls 140 having the planarized surfaces 141 may be recessed to form the depression c in each of the upper solder balls 140. In some example embodiments, the recess process may include at least one of a laser drilling process (LDP), a pressing process, an arc ion beam etching process, and a reflow process. In some example embodiments, the lower portion of the upper solder balls 140 may be evaporated by the LDP to form the depression c. In some example embodiments, a mechanical pressing process may be performed on the upper solder balls 140 at a high temperature, thereby forming the depressions c. In some example embodiments, an ion beam using electric arc may be applied to the lower portion of the upper solder ball 140, thereby forming the depression c by evaporating a portion of the upper solder ball 140. In some example embodiments, the upper semiconductor package 100 may be disposed on a solder resist substrate having an uneven surface such that the upper solder balls 140 come in contact with the uneven surface of the solder resist substrate, and then a reflow process may be performed to form the depressions c.

The depression c may have a shape that is concave toward the inside of the upper solder ball 140 (e.g., toward the upper package substrate 110). As illustrated in FIG. 1E, the depression c may have a semi-circular cross section. For example, the depression c may have a hemisphere shape. In some example embodiments, the depression c may have a triangular cross section, as illustrated in FIG. 2A. For example, the depression c of FIG. 2A may have a horn or a wedge shape. In some example embodiments, the depression c may have a rectangular cross section, as illustrated in FIG. 2B. For example, the depression c of FIG. 2B may have a rectangular parallelepiped shape. In some example embodiments, the depression c may have a trapezoidal cross section, as illustrated in FIG. 2C. For example, the depression c of FIG. 2C may have a poly-pyramid shape of which an apex is cut. In FIG. 1E, the upper solder balls 140 may have the same size (e.g., the same width and/or the same depth). However, example embodiments of the inventive concepts are not limited thereto.

In some example embodiments, the size (e.g., the width and/or the depth) of the depression c formed in one or some of the upper solder balls 140 may be different from that of the depression c formed in others of the upper solder balls 140. Thus, the amount of flux applied to the upper solder balls 140 may be varied depending on positions of the upper solder balls 140 in a process of applying the flux to the upper solder balls 140, as will be described later. In some example embodiments, as illustrated in FIG. 3A, widths w1 and/or depths d1, of first depressions c1 of the upper solder balls 140 adjacent to a central portion of the upper package substrate 110 may be formed to be greater than widths w2 and/or depths d2 of second depressions c2 of the upper solder balls 140 adjacent to a peripheral portion of the upper package substrate 110. Thus, the upper solder balls 140 may easily come in contact with the lower solder balls 140 when the upper semiconductor package 100 and/or the lower semiconductor package 200 are warped in a high-temperature subsequent process (e.g., a reflow process). These example embodiments may be applied when the upper semiconductor package 100 and/or the lower semiconductor package 200 are warped in a smile type (e.g., a U-shape) in which the central portions of the upper semiconductor package 100 and/or the lower semiconductor package 200 are concave. In some example embodiments, as illustrated in FIG. 3B, widths w1 and/or depths d1 of the first depressions c1 of the upper solder balls 140 adjacent to the central portion of the upper package substrate 110 may be formed to be smaller than widths w2 and/or depths d2 of the second depressions c2 of the upper solder balls 140 adjacent to the peripheral portion of the upper package substrate 110. These example embodiments may be applied when the upper semiconductor package 100 and/or the lower semiconductor package 200 are warped in a cry type (e.g., in an n-shape) in which the central portions of the upper semiconductor package 100 and/or the lower semiconductor package 200 are convex.

In some example embodiments, the depressions c may be formed in one or some of the upper solder balls 140. For example, the depressions c may be formed in only a group of the upper solder balls 140 that are adjacent to the central portion of the upper package substrate 110, as illustrated in FIG. 3C. These example embodiments may be applied when the upper semiconductor package 100 and/or the lower semiconductor package 200 are expected to be warped in the smile type (e.g., the U-shape) in which the central portions of the upper semiconductor package 100 and/or the lower semiconductor package 200 are concave. In some example embodiments, as illustrated in FIG. 3D, the depressions c may be formed in only a group of the upper solder balls 140 that are adjacent to the peripheral portion of the upper package substrate 110. These example embodiments may be applied when the upper semiconductor package 100 and/or the lower semiconductor package 200 are warped in the cry type (e.g., the ∩-shape) in which the central portions of the upper semiconductor package 100 and/or the lower semiconductor package 200 are convex.

Because the upper solder balls 140 have the depressions c having different sizes or the depressions c are formed in one or some of the upper solder balls 140, the warpage of the upper package substrate 110 may be compensated and co-planarity of the lower portions of the upper solder balls 140 may be improved. Thus, a bridge phenomenon and/or a non-wet failure phenomenon, which may be caused by the warpage of the upper package substrate 110 and/or the lower package substrate 210 occurring in the subsequent reflow process, may be mitigated or prevented. Thus, the semiconductor package with improved bonding reliability may be manufactured.

In the case in which the planarized surfaces 141 are formed at the bottom ends of the upper solder balls 140, portions of the planarized surfaces 141 may remain after the formation of the depressions c. For example, the upper solder balls 140 may not include an edge portion e, as illustrated in FIG. 4. The edge portions e of the upper solder balls 140 may be weak and may be thus varied or damaged during a process. The varied or damaged edge portions e may cause defects during subsequent processes. However, according to some example embodiments of the inventive concepts, because the planarized surfaces 141 are formed at the bottom ends of the upper solder balls 140 before the formation of the depressions c, the edge portions e that may be formed at the bottom ends of the upper solder balls 140 after the formation of the depressions c may be prevented or mitigated.

Referring to FIG. 1F, flux f may be applied to the upper solder balls 140. The flux f may fill the depressions c. In some example embodiments, applying the flux f may include bring the upper solder balls 140 into contact with the flux f provided in a flux pool. For example, the upper solder balls 140 are pasted with the flux f. The flux f may include at least one of a chloride, a fluoride, and resin. When the upper solder balls 140 are bonded to the lower solder balls 240, the flux f may surround contact portions therebetween to protect the contact portions from external contamination. Further, the flux f may inhibit or prevent an oxide from being generated on surfaces of the upper and lower solder balls 140 and 240 during the reflow process for bonding the upper solder balls 140 to the lower solder balls 240. Because the depressions c are formed in the upper solder balls 140 or the lower solder balls 240) in the semiconductor package according to some example embodiments of the inventive concepts, the amount of the flux f applied in the semiconductor package according to the inventive concepts may be greater than that of flux applied in a semiconductor package having spherical solder balls. Thus, bonding defects which may be caused by an oxide during the reflow process may be minimized or prevented.

In the above mentioned example embodiments, the depressions c formed in the upper solder balls 140 are described as an example. However, example embodiments of the inventive concepts are not limited thereto. In certain example embodiments, upper portions of the lower solder balls 240 may be processed to form depressions c in the lower solder balls 240, as illustrated in FIG. 5A. Method(s) of forming the depressions c in the lower solder balls 240 may be the same as or similar to the aforementioned method(s) of forming the depressions c in the upper solder balls 140. Thereafter, flux may be applied to the lower solder balls 240. As illustrated in FIG. 5B, flux f may fill the joint holes j in which the lower solder balls 240 are formed. The flux f filling each of the joint holes j may be a solid flux. At this time, a top surface of the flux f filling each of the joint holes j may be disposed at the same level as a top surface of the lower mold layer 230. Referring to FIG. 5C, in the case in which the flux f filling each of the joint holes j is the solid flux, the top surface of the flux f may be etched. At this time, the etched flux f may have a top surface which is concave t d the lower package substrate 210. The concave top surface of the flux f filling each of the joint holes j may perform the same function as the depression c of the lower solder ball 240 illustrated in 5A. Hereinafter, subsequent processes to be performed will be the same as or similar to the subsequent processes for the resultant structure of FIG. 1E. The subsequent processes to be described below may also be applied to the resultant structure of FIGS. 3A to 3D and the resultant structure of FIGS. 5A to 5C.

Referring to FIG. 1G, the upper semiconductor package 100 and the lower semiconductor package 200 may be aligned with each other such that the lower solder balls 240 are inserted into the depressions c of the upper solder balls 140. Thus, each of the upper solder balls 140 may come in contact with a corresponding one of the lower solder balls 240.

According to some example embodiments of the inventive concepts, the upper semiconductor package 100 and the lower semiconductor package 200 may be self-aligned with each other without an alignment component. For example, as illustrated in FIG. 6, the upper semiconductor package 100 may approach the lower semiconductor package 200 such that the upper solder balls 140 are adjacent to the lower solder balls 240, respectively. Thereafter, the upper and lower semiconductor packages 100 and 200 may be pressed or vibrated. Thus, the upper semiconductor package 100 may slide to be aligned with the lower semiconductor package 200 because the depressions c concave toward the insides of the upper solder balls 140 are formed in the upper solder balls 140. Accordingly, the upper solder balls 140 may be in contact with the lower solder balls 240, respectively, while preventing or mitigating misalignment between the upper semiconductor package 100 and the lower semiconductor package 200. Thus, the non-wet failure phenomenon of the semiconductor package may be reduced or prevented.

Figure 1H:
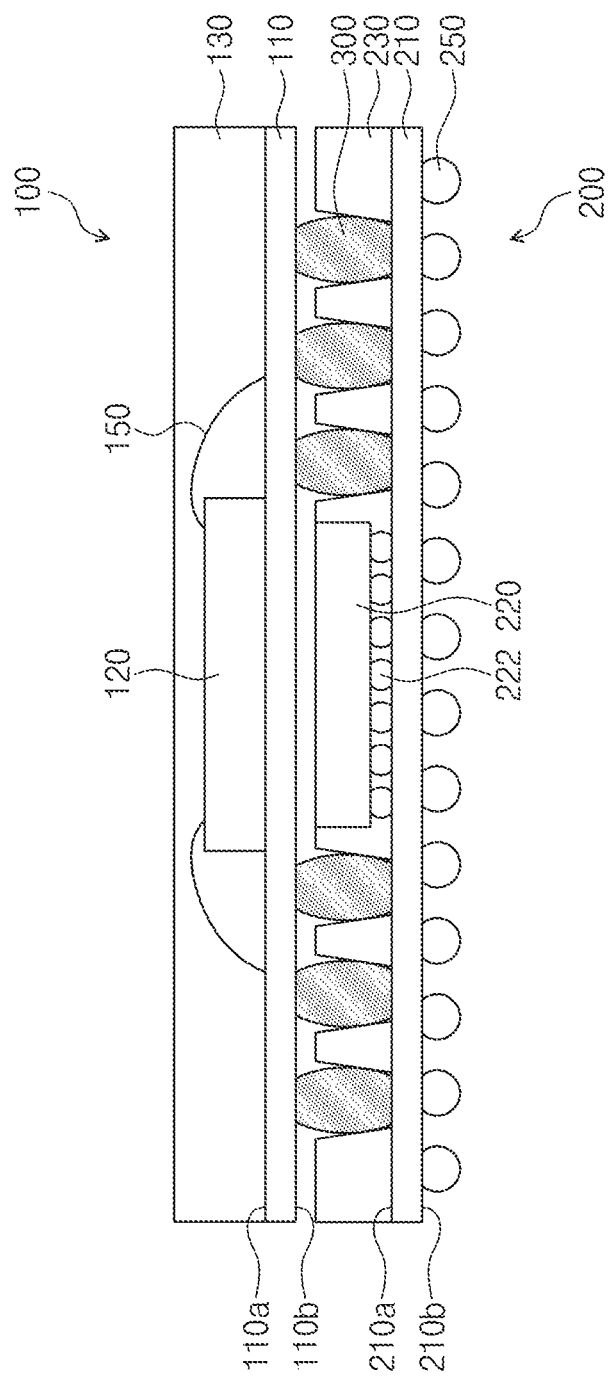

Referring to FIG. 1H, the reflow process may be performed on the lower solder balls 240 and the upper solder balls 140. Thus, the upper solder balls 140 may be combined with the lower solder balls 240 to form connection terminals 300. The connection terminals 300 may electrically connect the upper semiconductor package 100 to the lower semiconductor package 200.

Thereafter, the semiconductor package illustrated in FIG. 1H may be mounted on a board (not shown). The board (not shown) may be a board of a mobile product (e.g., a cellular or mobile phone) or a board of a memory module. Board terminals may be provided on the board (not shown). The external terminals 250 disposed on the second bottom surface 210b of the lower package substrate 210 may be combined with the board terminals of the board (not shown) such that the lower semiconductor package 200 may be electrically connected to the board (not shown). In some example embodiments, combining the external terminals 250 with the board terminals may be performed simultaneously with combining the upper solder balls 140 with the lower solder balls 240.

FIGS. 7A to 7D are cross-sectional views illustrating a method for manufacturing a semiconductor package, according to an example embodiment of the inventive concepts. FIGS. 8A and 8B are bottom views of an upper solder ball 140 to illustrate holes h formed in the upper solder ball 140. FIGS. 9A to 9D are cross-sectional views of holes in upper solder balls, according to some example embodiments of the inventive concepts. Hereinafter, the descriptions to the same technical features as illustrated in the above example embodiments will be omitted or mentioned briefly for the purpose of ease and convenience in explanation.

Figure 7A:
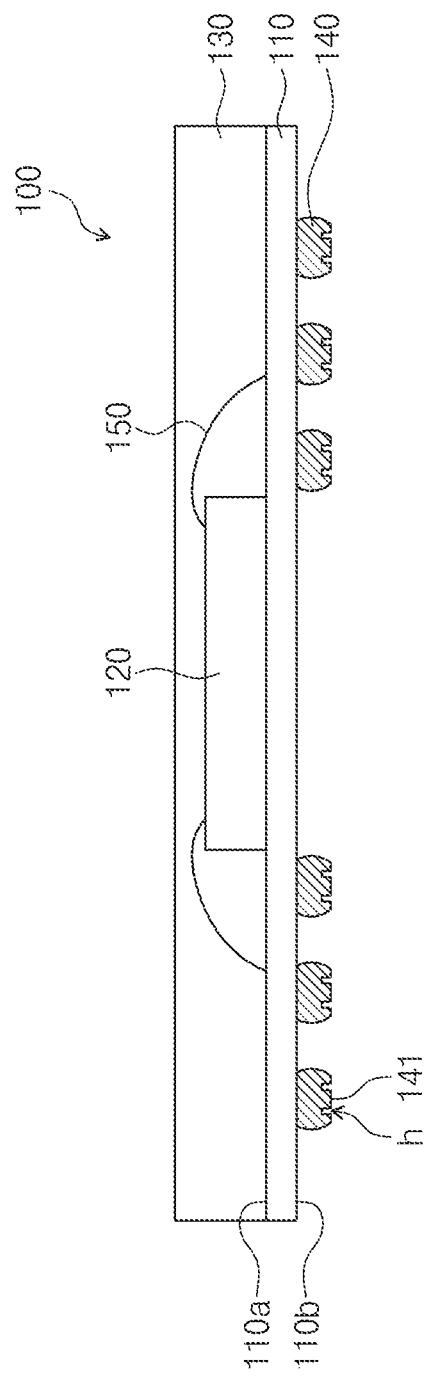
FIGS. 7A to 7D are cross-sectional views illustrating a method for manufacturing a semiconductor package, according to an example embodiment of the inventive concepts.
Figure 8A:
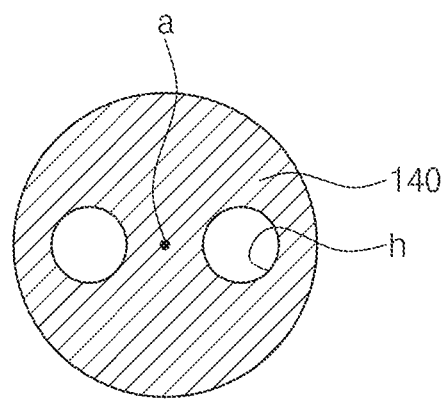
FIGS. 8A and 8B are bottom views of an upper solder ball to illustrate holes formed in the upper solder ball.
Figure 8B:
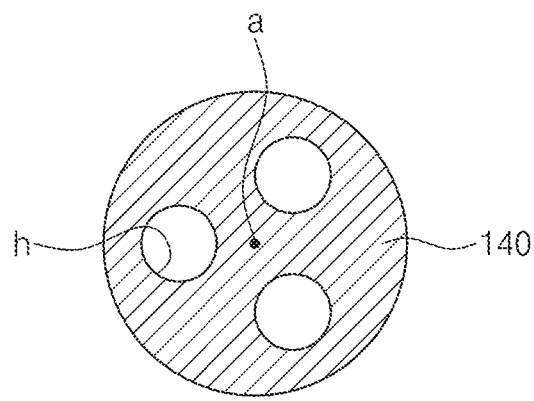

Referring to FIG. 7A, an upper semiconductor package 100 may include an upper package substrate 110, an upper semiconductor chip 120, an upper mold layer 130, and upper solder balls 140.

A recess process may be performed to form holes (or recesses) h in the upper solder balls 140. For example, the recess process may be performed on planarized surfaces 141 formed at bottom ends of the upper solder balls 140 to form the holes h. In some example embodiments, the process of forming the holes h in the upper solder balls 140 may include at least one of a laser drilling process (LDP), a pressing process, an arc ion beam etching process, and a reflow process. At this time, two or more holes h may be formed in each of the upper solder balls 140.

Positions of the holes h formed in the upper solder ball 140 may be symmetrical with respect to a perpendicular center axis a of the upper solder ball 140. As illustrated in FIG. 8A, when the number of the holes h formed in the upper solder ball 140 is two, the two holes h may be 180 degrees symmetrical with respect to the perpendicular center axis a of the upper solder ball 140. Alternatively, as illustrated in FIG. 8B, when the number of the holes h formed in the upper solder ball 140 is three, the three holes h may be formed around the perpendicular center axis a of the upper solder ball 140 by intervals of 120 degrees. Two or three holes h formed in the upper solder ball 140 are illustrated as an example in FIG. 8A or 8B. However, example embodiments of the inventive concepts are not limited thereto.

In FIG. 7A, the upper solder balls 140 may have the same number of the holes h. However, example embodiments of the inventive concepts are not limited thereto. In certain example embodiments, the numbers of the holes h formed in the upper solder balls 140 may be variously changed. Thus, the amount of flux applied to the upper solder balls 140 may be varied depending on positions of the upper solder balls 140 in a subsequent process of applying flux to the upper solder balls 140. In some example embodiments, the holes h may be formed in one or some of the upper solder balls 140. In some example embodiments, the holes h may be formed in only some of the upper solder balls 140 that are adjacent to a peripheral portion of the upper package substrate 110, as illustrated in FIG. 9A. In some example embodiments, the holes h may be formed in only some of the upper solder balls 140 that are adjacent to a central portion of the upper package substrate 110, as illustrated in FIG. 9B.

In some example embodiments, the number of the holes h formed in each of one or some of the upper solder balls 140 may be different from the number of the holes h formed in each of others of the upper solder balls 140. In some example embodiments, the number of the holes h formed in each of the upper solder balls 140 adjacent to the peripheral portion of the upper package substrate 110 may be more than the number of the holes h formed in each of the upper solder balls 140 adjacent to the central portion of the upper package substrate 110, as illustrated in FIG. 9C. In some example embodiments, the number of the holes h formed in each of the upper solder balls 140 adjacent to the central portion of the upper package substrate 110 may be more than the number of the holes h formed in each of the upper solder balls 140 adjacent to the peripheral portion of the upper package substrate 110, as illustrated in FIG. 9D. Hereinafter, subsequent processes performed on the structure of FIG. 7A will be described for the purpose of ease and convenience in explanation. The following subsequent processes also may be applied to the resultant structures of FIGS. 9A to 9D.

Figure 7B:
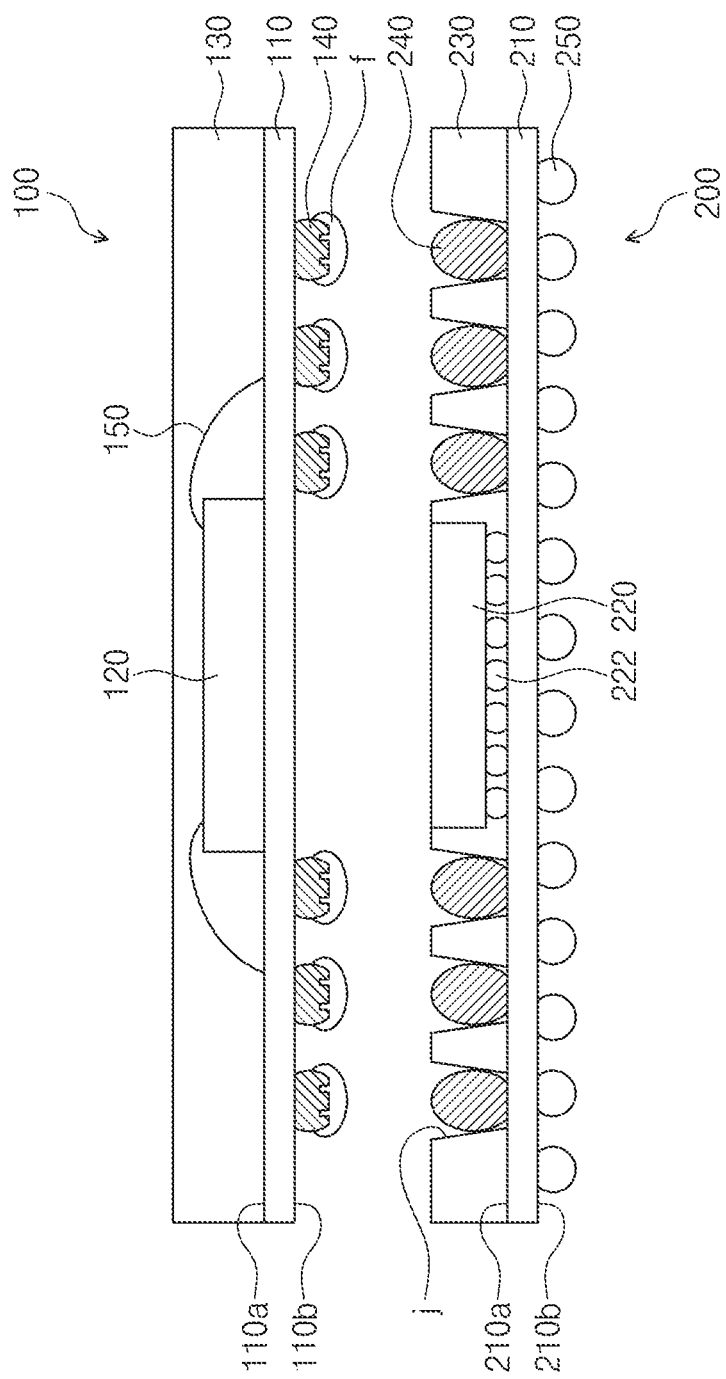

Referring to FIG. 7B, flux f may be applied to the upper solder balls 140. The flux f may fill the holes h. In some example embodiments, the flux f may be applied to the upper solder balls 140 by bring the upper solder balls 140 into contact with the flux f provided in a flux pool, e.g., by dipping the upper solder balls 140 in the flux f provided in the flux pool. The flux f may include at least one of a chloride, a fluoride, and resin.

Thereafter, the upper semiconductor package 100 may be disposed on a lower semiconductor package 200. The lower semiconductor package 200 may include a lower package substrate 210, a lower semiconductor chip 220, a lower mold layer 230, and lower solder balls 240.

Figure 7C:
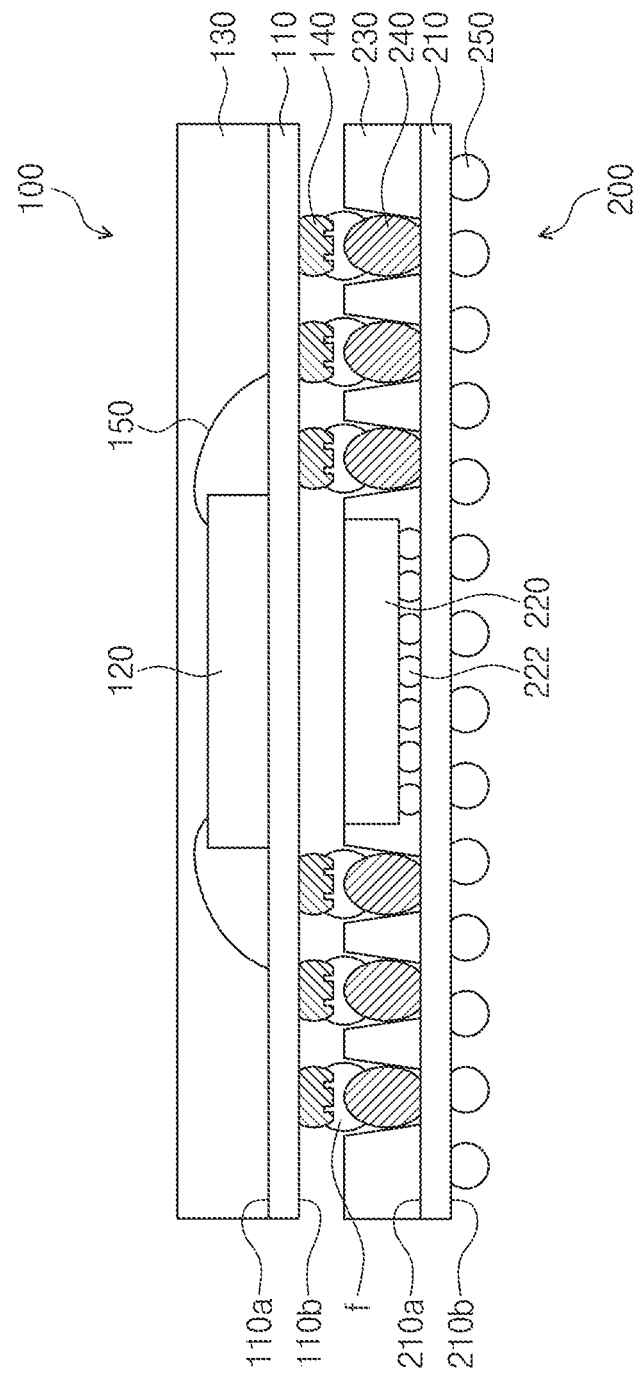

Referring to FIG. 7C, the upper semiconductor package 100 may be disposed on the lower semiconductor package 200 such that the upper solder balls 140 come in contact with the lower solder balls 240, respectively. The flux f may surround contact portions between the upper solder balls 140 and the lower solder balls 240 to protect the contact portions from external contamination and to inhibit or prevent an oxide from being generated during a reflow process of the upper and lower solder balls 140 and 240. Thus, bonding failure between the upper solder balls 140 and the lower solder balls 240 may be reduced or prevented.

Figure 7D:
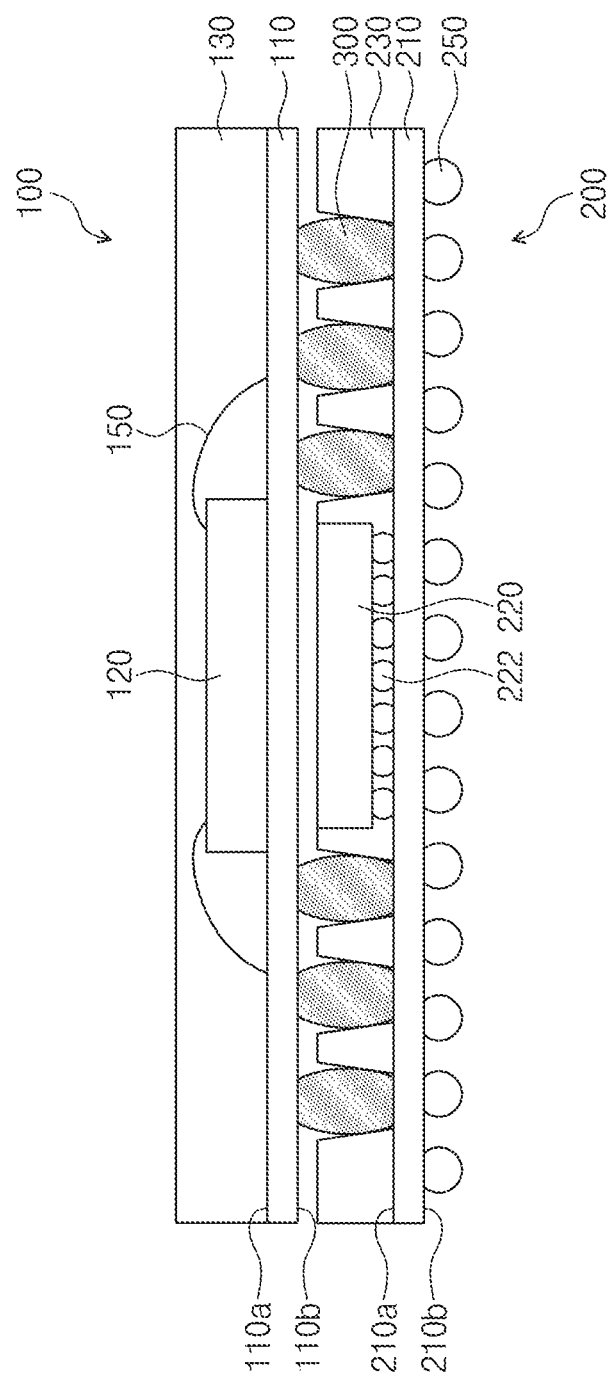

Referring to FIG. 7D, a reflow process may be performed on the upper solder balls 140 and the lower solder balls 240. For example, the upper solder balls 140 may be combined with the lower solder balls 240 to form connection terminals 300.

In the example embodiments described above, the semiconductor packages including the lower semiconductor packages including the lower solder balls are described as examples. However, example embodiments of the inventive concepts are not limited thereto. In certain example embodiments, the manufacturing method described with reference to FIGS. 5A to 5C may be applied in a case in which the lower semiconductor chip includes a conductive via, instead of the lower solder ball. This will be described in detail hereinafter.

Figure 10A:
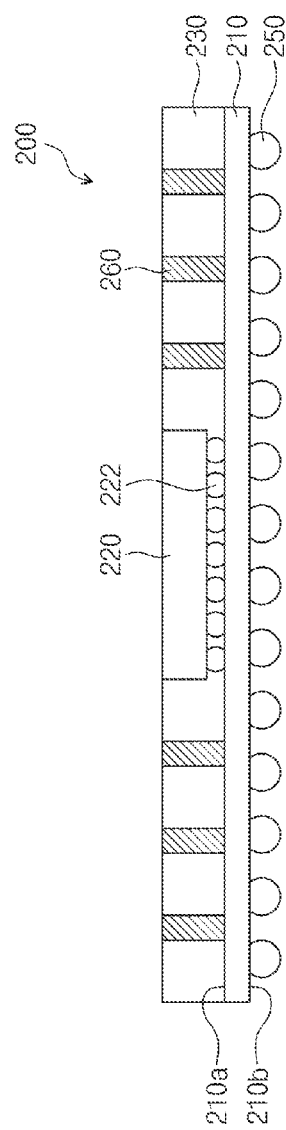
FIGS. 10A and 10B are cross-sectional views illustrating a method for manufacturing a semiconductor package, according to an example embodiment of the inventive concepts.
Figure 10B:
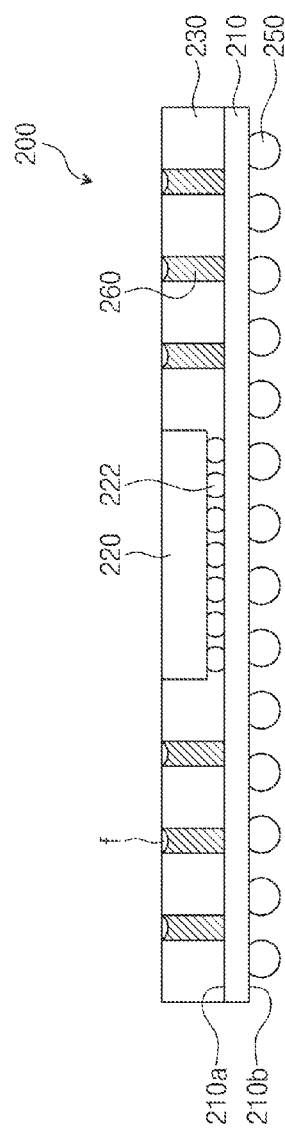

FIGS. 10A and 10B are cross-sectional views illustrating a method for manufacturing a semiconductor package, according to an example embodiment of the inventive concepts. FIGS. 11A and 11B are cross-sectional views illustrating a method for manufacturing a semiconductor package, according to an example embodiment of the inventive concepts. Hereinafter, the descriptions to the same technical features as in the above example embodiments will be omitted or mentioned briefly for the purpose of ease and convenience in explanation.

Referring to FIG. 10A, the lower semiconductor package 200 may include a conductive via 260. A hole exposing a portion of the lower package substrate 210 may be formed to penetrate the lower mold layer 230 of the lower semiconductor package 200, and the conductive via 260 may be formed in the hole by filling the hole with a conductive material. The conductive 260 may adhere to the second top surface 210a of the lower package substrate 210 so as to be electrically connected to the lower package substrate 210 and the lower semiconductor chip 220. In some example embodiments, a plurality of conductive vias 260 may be formed around the lower semiconductor chip 220.

The lower mold layer 230 may be disposed on the lower package substrate 210 to mold the lower semiconductor chip 220. For example, the lower mold layer 230 may expose the top surface of the lower semiconductor chip 220. However, example embodiments of the inventive concepts are not limited thereto. The lower mold layer 230 may surround the conductive via 260. A top surface of the conductive via 260 may be disposed at the same level as the top surface of the lower mold layer 230. For example, the top surface of the conductive via 260 may be exposed.

Referring to FIG. 10B, the top surface of the conductive via 260 may be etched. The etched top surface of the conductive via 260 may be concave toward the lower package substrate 210. The concave top surface of the conductive via 260 may perform the same function as the depression c of the lower solder ball 240 illustrated in FIG. 5A. Subsequently, flux f may be applied to the concave top surface of the conductive via 260. At this time, the flux f may be a solid flux. The flux f may fill the etched region of the conductive via 260.

In certain example embodiments, the top surface of the conductive via 260 may be disposed at a different level from the top surface of the lower mold layer 230. As illustrated in FIG. 11A, the top surface of the conductive via 260 may be disposed at a lower level than the top surface of the lower mold layer 230. For example, the conductive via 260 may be depressed from the top surface of the lower mold layer 230. The conductive via 260 may be formed to have a concave sidewall profile.

As illustrated in FIG. 11B, flux f may be applied to the top surface of the conductive via 260. At this time, the flux f may be a solid flux. A top surface of the applied flux f may be disposed at the same level as the top surface of the lower mold layer 230. In other word, the flux f may fill a region surrounded by the lower mold layer 230 and the conductive via 260. Thereafter, the top surface of the flux f may be etched. The etched top surface of the flux f may be concave toward the lower package substrate 210. The concave top surface of the flux f may perform the same function as the depression c of the lower solder ball 240 illustrated in FIG. 5A.

Subsequent processes may be the same as or similar to the processes described with reference to FIGS. 1G and 1H. In other word, the upper semiconductor package 100 may be disposed on the lower semiconductor package 200. The upper semiconductor package 100 may include the upper package substrate 110, the upper semiconductor chip 120, the upper mold layer 130, and the upper solder balls 140. The upper semiconductor package 100 may be disposed on the lower semiconductor package 200 such that the upper solder balls 140 come in contact with the conductive vias 260, respectively. The upper semiconductor package 100 and the lower semiconductor package 200 may be aligned with each other such that the upper solder balls 140 are inserted into the etched regions of the conductive vias 260 of FIG. 10B (or into the etched regions of the fluxes f of FIG. 11B). Thus, each of the upper solder balls 140 may be in contact with a corresponding one of the conductive vias 260. Thereafter, a reflow process may be performed on the upper solder balls 140 to electrically connect the upper solder balls 140 to the conductive vias 260, respectively.

Figure 12A:
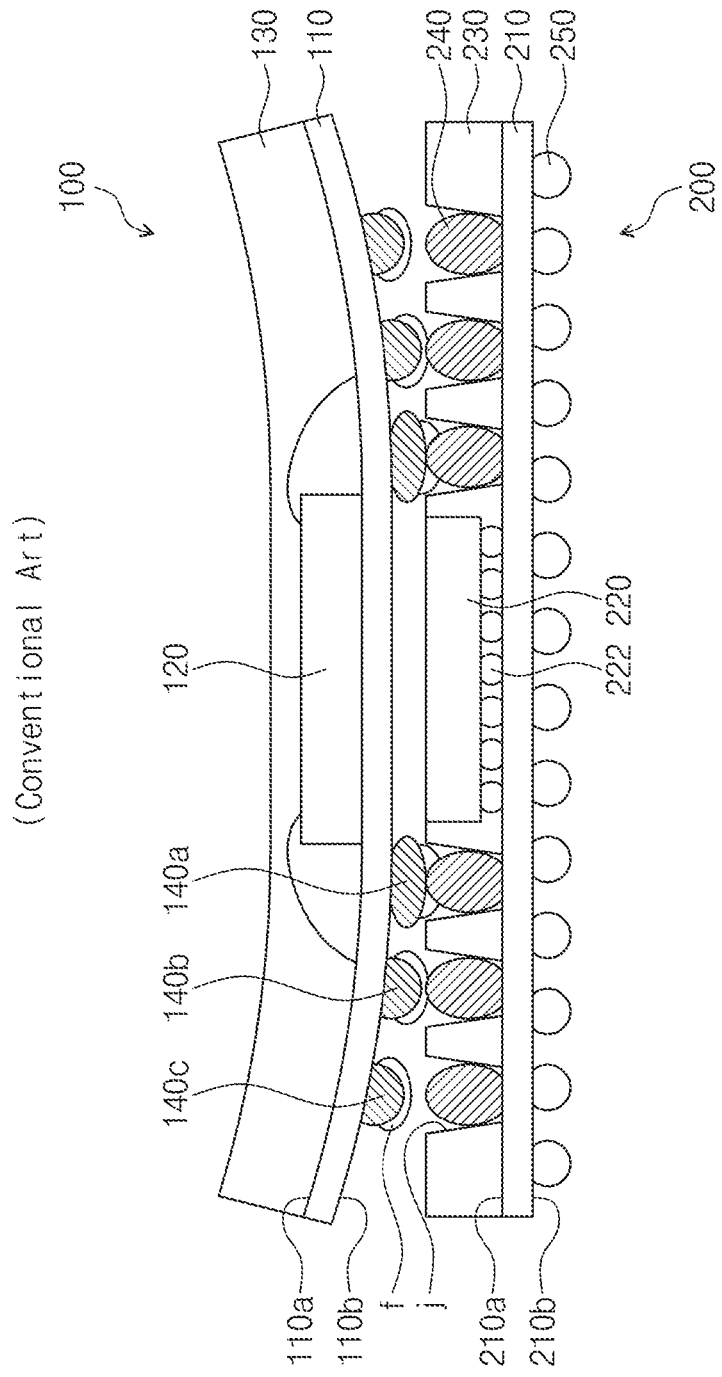
FIGS. 12A and 12B are cross-sectional views illustrating a reflow process of a conventional semiconductor package.
Figure 12B:
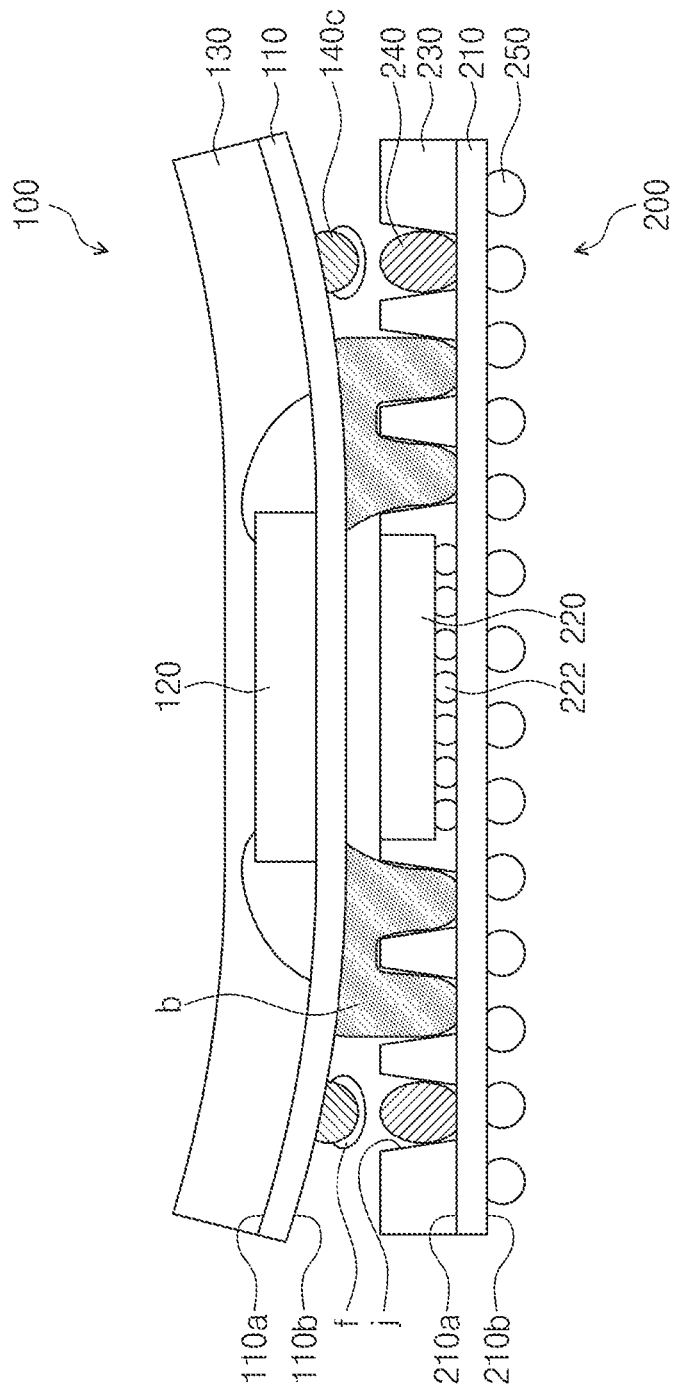

FIGS. 12A and 12B are cross-sectional views illustrating a reflow process of a conventional semiconductor package. When a conventional semiconductor package having spherical solder balls is warped, a bonding failure may be caused in a subsequent reflow process. Referring to FIG. 12A, when an upper semiconductor package 100 comes in contact with a lower semiconductor package 200 in a conventional semiconductor package, one or some (e.g., 140a) of upper solder balls 140a, 140b, and 140c may be come in excessive contact with a lower solder ball 240 disposed thereunder and/or others (e.g., 140c) of the upper solder balls 140a, 140b, and 140c may not come in contact with the lower solder ball 240 disposed thereunder. When a reflow process is performed in this case, the upper solder ball 140a and the upper solder ball 140b adjacent thereto may be connected to each other to cause a bridge b and/or the upper solder ball 140c may not be combined with the lower solder ball 240 after the reflow process, as illustrated in FIG. 12B.

However, according to some example embodiments of the inventive concepts, because a plurality of depressions c or holes h are formed in the upper solder balls 140, the amount of the flux f applied to the upper solder balls 140 may be greater than that of flux applied to solder balls not having the depressions c or the holes h. The amount of the flux f applied to the upper solder balls 140 may be increased to reduce or prevent the non-wet failure between the upper solder balls 140 and the lower solder balls 240 from occurring. Further, the sizes of the depressions c formed in the upper solder balls 140 may be varied depending on positions of the upper solder balls 140 or the number of the holes h formed in the upper solder balls 140 may be variously changed depending on the positions of the upper solder balls 140. Thus, the amount of the flux f applied to the upper solder ball 140 may be variously adjusted according to the position of the upper solder ball 140, thereby reducing or prevent from occurring contact failure of the solder balls 140 and 250, that may be caused by the warpage or bend of the lower semiconductor package 200 and/or the upper semiconductor package 100.

In the method for manufacturing a semiconductor package according to some example embodiments of the inventive concepts, the depression or the holes may be formed in the upper solder ball of the upper semiconductor package or the lower solder ball of the lower semiconductor package, thereby increasing the amount of the flux applied to the solder balls. Accordingly, the bridge and/or the non-wet failure between the solder balls, which may be caused by the warpage of the upper semiconductor package and/or the lower semiconductor package, may be inhibited or prevented from occurring.

Further, due to the depression formed in the solder ball of the upper or lower semiconductor package, the upper semiconductor package may b coupled to the lower semiconductor package while mitigating or preventing misalignment therebetween from occurring.

While the inventive concepts have been described with reference to some example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for manufacturing a semiconductor package, the method comprising:
   providing an upper semiconductor package, the upper semiconductor package including a first package substrate and a first solder ball, the first package substrate having a first surface and a second surface opposite to the first surface, the first solder ball on the first surface;
   providing a lower semiconductor package, the lower semiconductor package including a second package substrate and a second solder ball, the second package substrate having a third surface and a fourth surface opposite to the third surface, the second solder ball on the third surface;
   forming a depression in the first solder ball, and not forming a depression in the second solder ball;
   applying flux to the first solder ball to fill the depression;
   aligning the upper semiconductor package and the lower semiconductor package with each other such that the second solder ball is inserted into the depression; and
   performing a reflow process to combine the first solder ball with the second solder ball.

2. The method of claim 1, further comprising:
   performing, before the forming a depression, a planarization process to form a planarized surface of the first solder ball,
   wherein the planarized surface is spaced apart from the first surface and is substantially parallel to the first surface.

3. The method of claim 2, wherein the performing a planarization process includes:
   disposing the upper semiconductor package on a solder resist substrate such that the first solder ball is brought into contact with a surface of the solder resist substrate;
   reflowing the first solder ball; and
   pressing the first solder ball.

4. The method of claim 1, wherein
   the upper semiconductor package further includes a first semiconductor chip on the second surface, the first semiconductor chip electrically connected to the first solder ball, the lower semiconductor package further includes a second semiconductor chip on the third surface, the first semiconductor chip electrically connected to the second solder ball, and the aligning includes disposing the upper semiconductor package on the lower semiconductor package.

5. The method of claim 1, wherein the upper semiconductor package further includes a first semiconductor chip on the first surface, the first semiconductor chip electrically connected to the first solder ball, the lower semiconductor package further includes a second semiconductor chip on the fourth surface, the second semiconductor chip electrically connected to the second solder ball, and the aligning includes disposing the lower semiconductor package on the upper semiconductor package.

6. The method of claim 1, wherein the forming a depression in the first solder ball includes:

performing at least one of a laser drilling process (LDP), a pressing process, an arc ion beam etching process, and a reflow process.

7. The method of claim 1, wherein the upper semiconductor package further includes a plurality of first solder balls including the first solder ball, and the forming a depression includes forming a plurality of depressions, which includes a first depression and a second depression such that at least one of a width and a depth of the first depression is different from at least one of a width and a depth of the second depression.

8. The method of claim 7, wherein the forming a plurality of depressions includes:

forming the first depression in one solder ball, from among the solder balls, adjacent to a central portion of the first package substrate and forming the second depression in another solder ball, from among the first solder balls, adjacent to a peripheral portion of the first package substrate, such that at least one of the width and the depth of the first depression is smaller than at least one of the width and the depth of the second depression.

9. The method of claim 1, wherein the upper semiconductor package further includes a plurality of first solder balls including the first solder ball, and the forming a depression includes forming one or more depressions, which includes the depression, in one or more of the first solder balls, respectively.

10. The method of claim 1, wherein the aligning includes:

approximating the upper semiconductor package to the lower semiconductor package; and vibrating the upper semiconductor package and the lower semiconductor package such that the second solder ball is inserted into the depression of the first solder ball.

11. A method for manufacturing a semiconductor package, the method comprising:

providing a first semiconductor package, the first semiconductor package including a first package substrate, a semiconductor chip, a mold layer, the semiconductor chip bonded to the first package substrate in a flip-chip manner, the mold layer surrounding the semiconductor chip on the first package substrate;

providing a second semiconductor package, the second semiconductor package including a second package substrate and a solder ball;

forming a through hole through the mold layer;

forming a conductive via in the through hole such that a top surface of the conductive via being one of equal to and lower than a top surface of the mold layer;

forming a concave portion defined by the top surface of the conductive via and the mold layer;

applying flux to the concave portion;

aligning the first semiconductor package and the second semiconductor package with each other such that the solder ball is inserted into the concave portion; and performing a reflow process to combine the solder ball with the conductive via.

12. The method of claim 11, wherein the forming a concave portion includes recessing the conductive via such that the top surface of the conductive via is lower than a top surface of the mold layer.

13. The method of claim 11, wherein the forming a conductive via includes forming the conductive via to have a concave sidewall profile.

14. The method of claim 11, wherein the aligning includes vibrating at least one of the first semiconductor package and the second semiconductor package such that the solder ball of the second semiconductor package is inserted into the concave portion.

15. The method of claim 11, wherein the providing a first semiconductor package includes forming the mold layer to expose a top surface of the semiconductor chip.

* * * * *